United States Patent [19]

Streifer et al.

[11] Patent Number: 4,719,634
[45] Date of Patent: Jan. 12, 1988

[54] SEMICONDUCTOR LASER ARRAY WITH FAULT TOLERANT COUPLING

[75] Inventors: William Streifer; Peter Cross, both of Palo Alto; Donald R. Scifres, San Jose, all of Calif.

[73] Assignee: Spectra Diode Laboratories, Inc., San Jose, Calif.

[21] Appl. No.: 924,196

[22] Filed: Oct. 27, 1986

[51] Int. Cl.$^4$ .............................................. H01S 3/19
[52] U.S. Cl. ....................................... 372/46; 372/45; 372/50
[58] Field of Search ...................... 372/44, 46, 50, 45, 372/48; 357/17

[56] References Cited

U.S. PATENT DOCUMENTS

Re. 31,806 1/1985 Scifres et al. .......................... 372/50
4,255,717 3/1981 Scifres et al. .......................... 372/50

OTHER PUBLICATIONS

D. R. Scifres et al.; "Semiconductor Lasers with Integrated Interferometric Reflectors"; American Institute of Physics; vol. 30, No. 11, Jun. 1, 1977.

*Primary Examiner*—James W. Davie
*Assistant Examiner*—B. Randolph

[57] ABSTRACT

A semiconductor laser array having a plurality of sets of interconnecting waveguides, each joining two optical waveguides together at respective branching junctions. The array has a plurality of semiconductor layers disposed on a substrate, at least one of the layers forming an active region for light wave generation and propagation under lasing conditions. One or more structures, such as current confining channels, a channelled substrate and variable thickness active region define a plurality of adjacent optical emitting waveguides. The waveguides are coupled together in a coupling geometry which ensures that breaks or failures in one or more branches are bypassed, thereby maintaining in-phase laser array operation.

24 Claims, 7 Drawing Figures

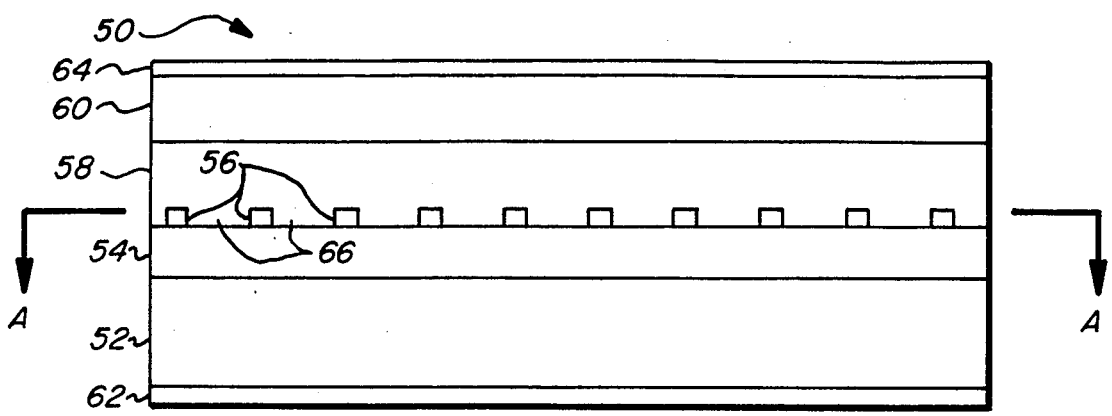
FIG._1.
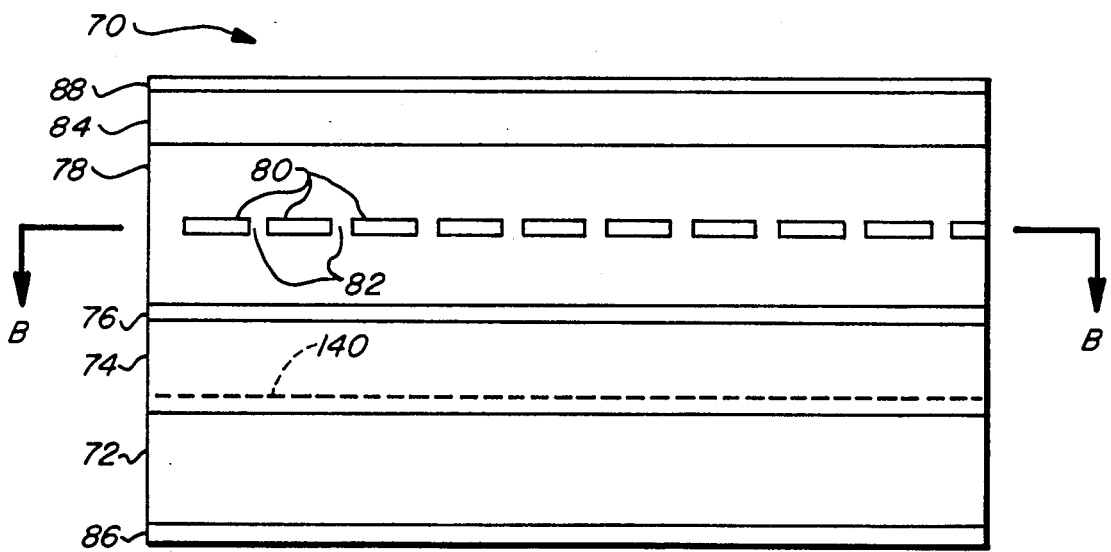
FIG._2.
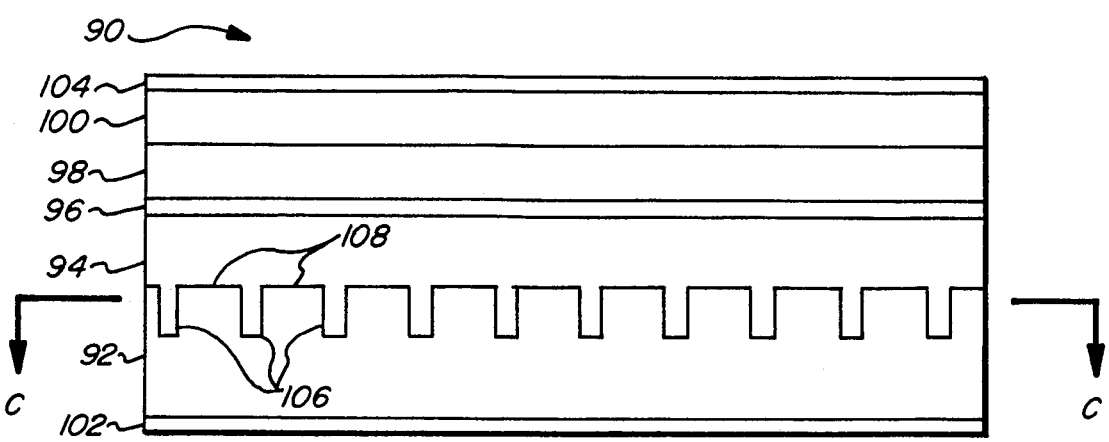
FIG._3.

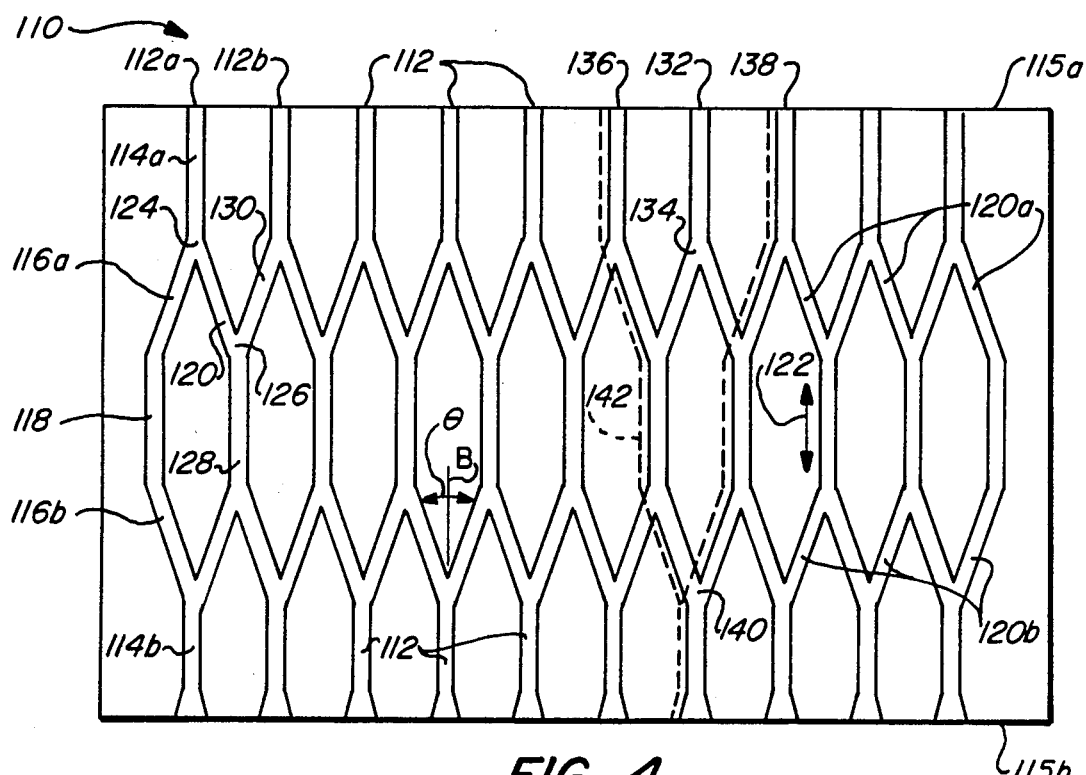
FIG._4.
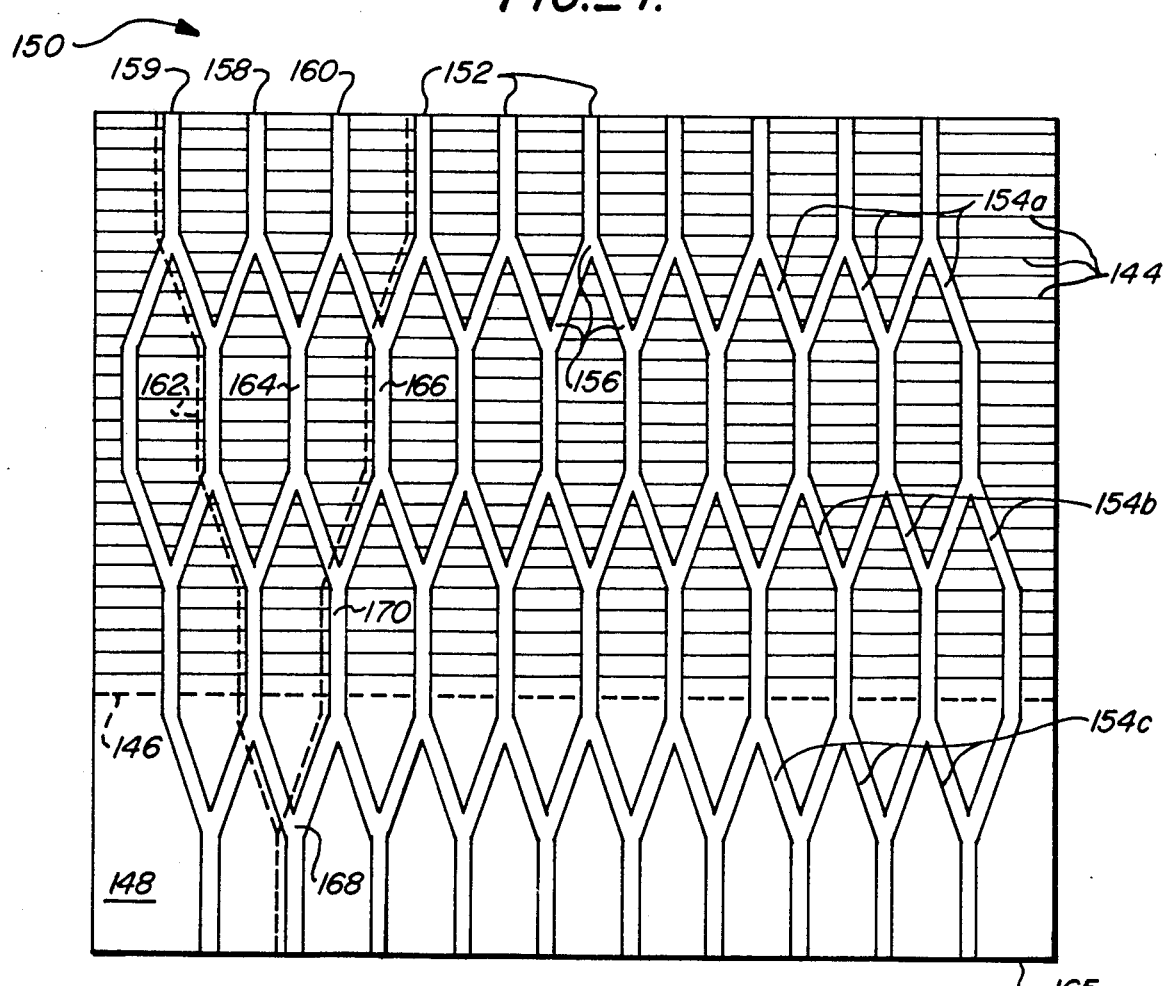
FIG._5.

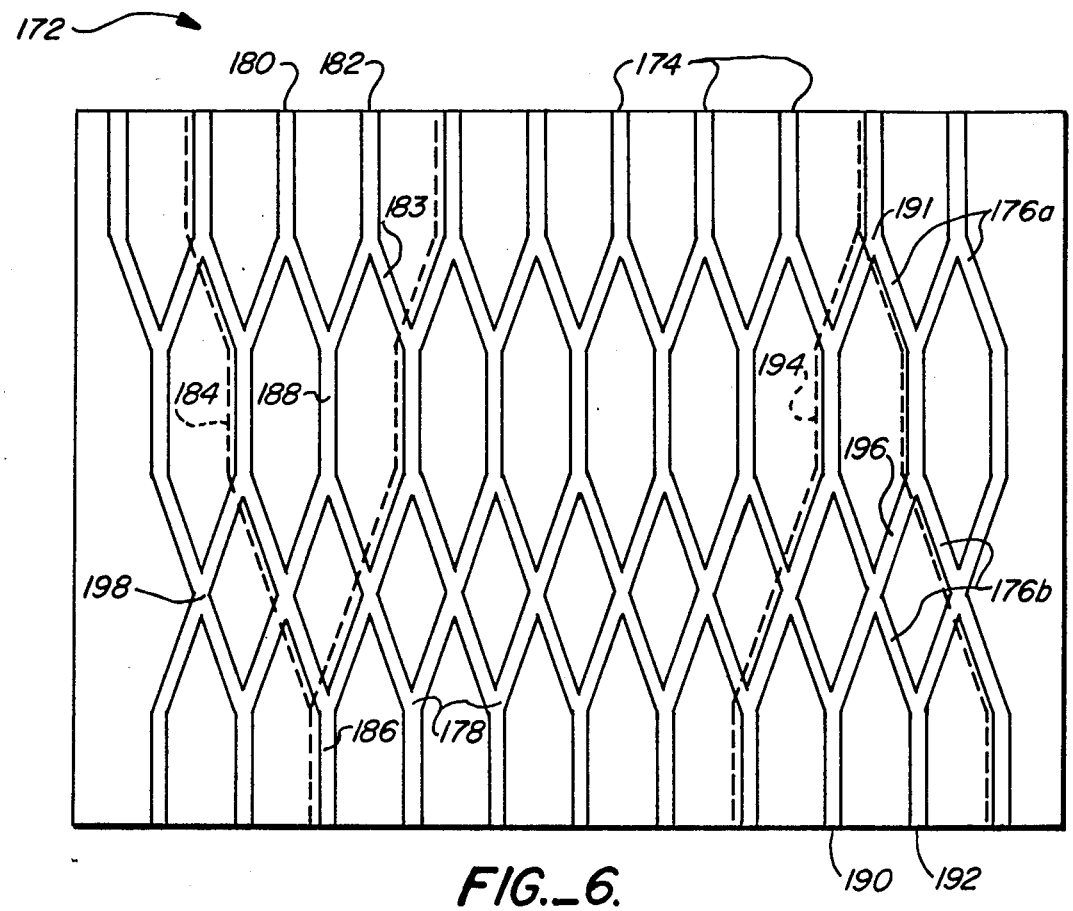
FIG._6.
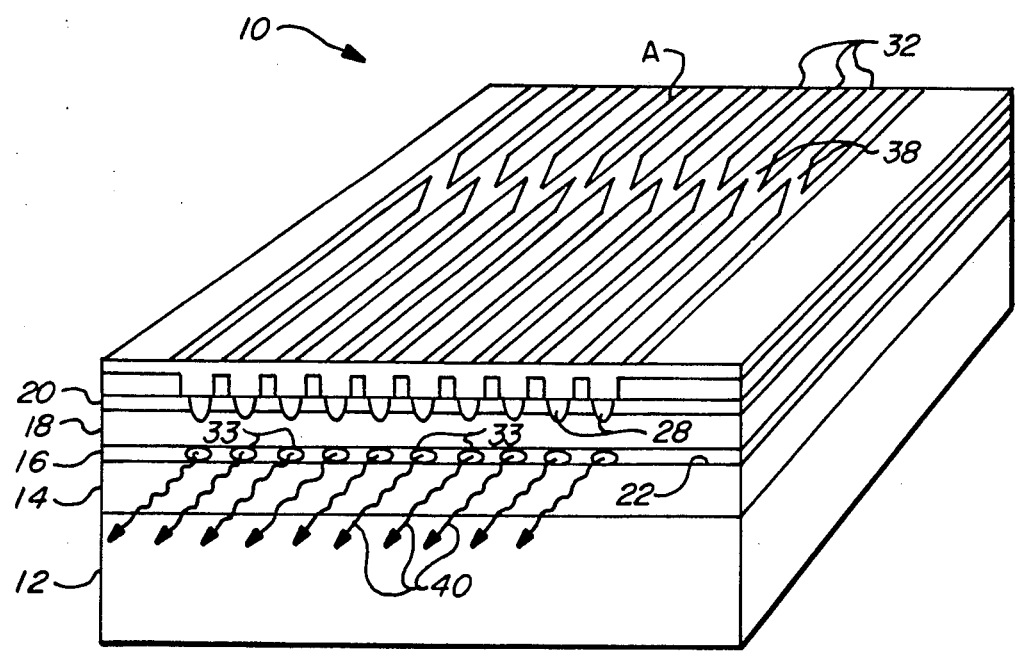
FIG._7. (PRIOR ART)

4,719,634

SEMICONDUCTOR LASER ARRAY WITH FAULT TOLERANT COUPLING

DESCRIPTION

TECHNICAL FIELD

The present invention relates to semiconductor laser arrays and in particular to such lasers with junction coupled waveguides for phased array operation.

BACKGROUND ART

Semiconductor laser arrays are monolithic laser devices having a plurality of spatially displaced emitters in an active layer of a semiconductor body acting as a waveguide for light wave propagation under lasing conditions. In such laser arrays it is desired to mutually couple the waveguides together so that light waves in each waveguide are at the same wavelength and radiate from a front facet of the laser array device in-phase with each other to thereby reduce beam divergence. One well known means for coupling is provided by reducing the separation between adjacent waveguides sufficiently to achieve optical wave overlapping or "evanescent coupling" of light waves propagating in adjacent waveguides.

A second manner of coupling, called "direct coupling", is described by Scifres et al. in U.S. Pat. No. 4,255,717 and reissue patent No. 31,806. In this laser device 10, shown in FIG. 7 herewith, layers 14, 16, 18 and 20 of GaAlAs or other semiconductor materials are deposited on a substrate 12. Layer 16 with the highest index of refraction and lowest bandgap is the active layer, providing a waveguide for light wave propagation under lasing conditions along the plane of the p-n junction 22. A plurality of waveguides 33 is defined by a current confining channel geometry comprising zinc diffusion 28 through a blocking layer 20 and parallel contact stripes 32, for example. Other techniques for defining the current paths and thereby the waveguides such as proton implantation are also described. The waveguides are directly coupled by interconnecting stripes 38. Other light coupling structures are also described. Light wave portions propagating in one waveguide will split off and be deflected into an adjacent waveguide where they will combine with light wave portions propagating in that adjacent waveguide. Out-of-phase modes of the light waves will radiate out of the waveguide junction and be lost when the waveguides are recombined. Only the mode in which all emitters are in-phase can oscillate, and the resulting emitted light 40 will be coherent and have a smaller beam divergence.

A problem with semiconductor laser arrays which employ mutually coupled waveguides is that if one or more waveguides cease to lase, the entire device may no longer operate in-phase. For example, in the directly coupled laser array seen in FIG. 7, if any single branch of an emitting cavity, such as the one labeled A, no longer lases, the coupling between the two parts of the array will be broken. Light wave portions propagating in waveguides on one side of the breach will be in-phase, as will light wave portions propagating in waveguides on the other side of the breach, but the light wave portions on each side may not be in-phase with each other.

Accordingly, it is an object of the present invention to provide a semiconductor laser array which remains coupled in-phase when one or more lasing branches fail to operate.

DISCLOSURE OF THE INVENTION

The above object has been achieved with a semiconductor laser array having fault tolerant waveguide geometries. Such geometries are provided by a plurality of sets of interconnecting waveguides for deflecting and directly coupling light waves propagating in adjacent optical emitting waveguides. The optical emitting waveguides are defined in an active region by waveguide structures in the active region or in optical proximity to the active region. Each set of interconnecting waveguides couples together all of the elements in the array and is spaced apart in a direction of light propagation along the optical waveguides from other sets of interconnecting waveguides. Thus, the multiple sets of interconnecting waveguides provide redundant operation in the event of a segment failure so as to bypass the break. Two sets of interconnections provide a single redundancy which compensates for single isolated breaks, while three sets of interconnections provide a double redundancy which can compensate for breaks in two adjacent segments or a break in one of the interconnecting waveguides.

The semiconductor laser array comprises a plurality of semiconductor layers disposed on a substrate. At least one of the layers forms an active region adjacent to a p-n junction for light wave generation and propagation under lasing conditions in a plurality of adjacent optical emitting waveguides. Electrical contact layers below the substrate and above the top semiconductor layer provide forward biasing of the active region in order to produce the light waves. Each interconnecting waveguide joins two adjacent waveguide segments at a Y-shaped junction comprising a Y-base and two Y-branches. The straight waveguides and the interconnecting waveguides are defined either by current confining channels, such as gaps etched through a blocking layer, by refractive index changes in the semiconductor layers, such as by changes in thickness of one or more layers, or both. Other means of gain or real-refractive-index waveguiding are also possible. A reflection means such as cleaved facets, distributed feedback or external reflectors are required to produce laser oscillation.

BRIEF DESCRIPTION OF DRAWINGS

FIG. 1 is a side plan of a semiconductor laser array of the present invention.

FIG. 2 is a side plan of a second semiconductor laser array of the present invention.

FIG. 3 is a side plan of a third semiconductor laser array of the present invention.

FIG. 4 is a sectional view of a first coupling geometry taken along the lines A—A in FIG. 1, B—B in FIG. 2 or C—C in FIG. 3.

FIG. 5 is a sectional view of a second coupling geometry taken along the lines A—A in FIG. 1, B—B in FIG. 2 or C—C in FIG. 3.

FIG. 6 is a sectional view of a third coupling geometry taken along the lines A—A in FIG. 1, B—B in FIG. 2 or C—C in FIG. 3.

FIG. 7 is a perspective view of a semiconductor laser array of the prior art.

BEST MODE OF CARRYING OUT THE INVENTION

With reference to FIG. 1, a semiconductor laser array 50 comprises a substrate 52 upon which are disposed layers 54, 56, 58 and 60 of semiconductor material. Laser array 50, as well as other laser structures hereinafter described, may be fabricated on a wafer substrate by liquid phase epitaxy, molecular beam epitaxy or preferably metal-organic chemical vapor deposition, which crystal growth processes are known in the art. The wafer is then sectioned into pieces and mounted on heatsinks.

Substrate 52 and layers 54, 58 and 60 may be composed, respectively, of n-GaAs; n-Ga$_{1-x}$Al$_x$As; p-Ga$_{1-z}$Al$_z$As and p-GaAs, where x and z may be equal. Typically x and z are in the range from 0.3 to 0.4. The doping levels of the layers are preferably $8 \times 10^{17}$ cm$^{-3}$ (Se) for n-type cladding layer 54, $2 \times 10^{18}$ cm$^{-3}$ (Mg) for p-type cladding layer 58 and $10^{19}$ cm$^{-3}$ (Zn) for p-type cap layer 60. Layer 56 is not intentionally doped and typically consists of four 0.012 μm thick quantum wells of Ga$_{0.95}$Al$_{0.05}$As alternating with three 0.006 μm thick barriers of Ga$_{0.80}$Al$_{0.20}$As, making layer 56, with the highest index of refraction and the lowest effective band gap, the active region for light wave generation and propagation under lasing conditions.

It will of course be recognized that the conductivity type of the layers may be reversed. Likewise, instead of GaAs and GaAlAs, other light emitting semiconductor materials, such as GaAlSb, InP, InGaAsP, other III-V alloys, II-VI alloys and IV-VI alloys, may be used. Further, instead of a plurality of thin layers in a quantum-well or multiple-quantum-well heterostructure, the active region 56 may be formed from a single layer of Ga$_{1-y}$Al$_y$As where y is typically, but not necessarily, less than 0.1. Quantum-well structures are known and described in an article by N. Holonyak, Jr., et al. entitled "Quantum-well Heterostructure Lasers" in IEEE Journal of Quantum Electronics, vol. QE-16, no. 2 (February 1980), pp. 170-186.

Laser array 50 is provided with conductive contact layers 62 and 64 deposited on substrate 52 and cap layer 60 respectively. Conductive contact layers 62 and 64 provide a metallization for electrode connection and forward biasing of laser array 50 generating light waves in active region 56. Layers 62 and 64 may be Au/Ge and Ti/Pt/Au alloys respectively.

In laser array 50, active region 56 is of nonuniform thickness. Optical emitting waveguides are defined by regions where active region 56 is thickest. Gaps 66 are areas where active region 56 is of minimum and possibly zero thickness. Desired patterns of thickness variation are an important feature of the present invention and are seen in FIGS. 4–6. These thickness variations in active region 56 may be produced by selectively etching away gap areas 66 of active region 56, then disposing layer 58 over active region 56. After growing 0.3 μm of p-type cladding layer 58, a 0.05 μm GaAs layer is deposited to passivate the surface. A desired pattern is then defined in a photoresist layer by optical lithography. After pattern definition the wafer is etched in a standard solution. The etch time is calibrated so that the etch goes through the active region 56. Typical etch rates for this solution are 0.4 μm/min, resulting in etch times of approximately 50 sec to etch through the 0.3 μm p-type cladding layer 58 and 0.066 μm active region 56. The photoresist is then stripped in solvents, such as acetone, and the wafer is etched again for 10 sec in the same etch solution to remove the GaAs passivation layer and to produce a clean surface for growth. The cladding layer 58 is then regrown with the same Ga$_{1-z}$Al$_z$As material, where z is typically between 0.3 and 0.4, as before. P-type cap layer 60 is finally added. The semiconductor material of layer 58 fills gap areas 66 between thick portions of active region 56. Layer 58 has a lower index of refraction and higher bandgap than active region 56, thereby causing light waves to be index guided within the thicker, remaining waveguide portions of active region 56. Remaining portions of active region 56 are typically about 1.5 μm wide and spaced 5 μm apart.

With reference to FIG. 2, a second semiconductor laser array 70 is similar to laser array 50 of FIG. 1 and has a substrate 72 and a plurality of semiconductor layers 74, 76, 78, 80 and 84 disposed on the substrate. Substrate 72 and layers 74, 76, 78 and 84 are typically composed of n-GaAs; n-Ga$_{1-x}$Al$_x$As; p-Ga$_{1-y}$Al$_y$As; p-Ga$_{1-z}$Al$_z$As; and p-GaAs respectively where x and z are typically in the range 0.3 to 0.4 and y is typically in the range from 0.0 to 0.1. Conductive layers 86 and 88, on substrate 72 and cap layer 84 respectively, provide forward biasing of laser array 70 for generating light waves in an active region 76. Unlike active region 56 in laser array 50 of FIG. 1, active region 76 is of a generally uniform thickness.

Waveguides are defined by current confining channels 82 in a current blocking layer 80 communicating with active region 76. A portion of layer 78, typically about 0.25 to 0.5 microns thick, is disposed over active region 76. Blocking layer 80 is then disposed over layer 78. Gaps 82 defining current confining channels are etched in a pattern through blocking layer 80. Desired patterns are those seen in FIGS. 4–6. Gaps 82 are typically 1.5 μm wide and spaced 5 μm apart. Finally, the remainder of layer 78, typically about 1.5 microns thick, is disposed over blocking layer 80, the semiconductor material of layer 78 filling the gaps 82 in blocking layer 80. Blocking layer 80 is typically composed of nGaAs. Since layer 78 is p-GaAlAs, the n-type semiconductor material of layer 80 acts as a barrier to current. Current flow is confined to those areas where gaps 82 in layer 80 are present and gain guiding, real-refractive-index waveguiding or both will occur in the active region 76 under the openings 82.

In FIG. 3, a third semiconductor laser array 90 is similar in material and construction to laser arrays 50 and 70 in FIGS. 1 and 2. Laser array 90 comprises a substrate 92 upon which are disposed semiconductor layers 94, 96, 98 and 100. Conductive layers 102 and 104 are disposed on substrate 92 and cap layer 100 respectively for providing electrical contacts for forward biasing laser array 90. Layer 96 forms an active region for light wave generation and propagation under lasing conditions, and is generally of uniform thickness.

Channels 106 in substrate 92 define optical waveguides in the active region 96 by means of refractive index changes with which light waves propagating in active region 96 interact. Channels 106 may be etched or otherwise formed in substrate 92 in accord with a desired pattern, such as those shown in FIGS. 4–6. Channels 106 are typically 1.5 μm wide and spaced 5 μm apart. Layer 94 is then disposed on the channelled substrate 92. Channels 106 are thus filled with semiconductor material of layer 94 while areas 108 adjacent to channels 106 are composed of substrate material. Substrate 92 is typically composed of GaAs having an index of refraction of approximately 3.6 whereas layer 94 is typically composed of $Ga_{0.7}Al_{0.3}As$ having an index of refraction of approximately 3.4. Thus, optical waveguides are defined in active region 96 above channels 106 where the cladding is unaffected by substrate 92, and optical power above regions 108 leaks into the substrate and radiates away.

The structures of FIGS. 1–3 are not exclusive in that other techniques for delineating an array of waveguides are known to those versed in the art.

With reference to FIGS. 4–6, three desired coupling geometries are shown which represent a principal feature of this invention. In each of these coupling geometries, any of the three semiconductor laser arrays in FIGS. 1–3 or other such arrays may be used. Thus, each of the coupling geometries in FIGS. 4–6 represents a top sectional view taken alternatively through the various optical waveguide structures defining the laser array, i.e. through the active region 56 along the line A—A in FIG. 1, through the blocking layer 80 along the line B—B in FIG. 2, or through the channels 106 in substrate 92 along the line C—C in FIG. 3. Semiconductor laser arrays other than those described above and having other or additional waveguide structures may also be used with the coupling geometries of FIGS. 4–6.

In FIG. 4, a coupling geometry 110 comprises a plurality of adjacent optical emitters 112 defined by waveguides. Preferably, each of the waveguides supports at most one transverse optical mode. Typically, cavities 112 are about 1.5 μm wide, and 5 μm apart. Each waveguide 112 in FIG. 4 consists of end portions 114a and 114b adjacent to reflective cleaved facets 115a and 115b respectively, branch portions 116a and 116b connected to respective end portions 114a and 114b, and a central portion 118 connecting branch portions 116a and 116b. Facets 115a and 115b provide optical feedback to sustain laser operation. Rear facet 115a may be coated to produce a high reflectivity and light may be emitted predominantly from the laser array out of front facet 115b. In order to produce a single far field lobe, the fill factor in the near field is preferably greater than 75%. Therefore, the waveguides can be expanded in a flared region of end portion 114b to a width of about 4 μm at front facet 115b. Preferably, the flared region is about 50 μm long, thereby restricting the angle of flare to less than about 4 degrees. This invention, however, neither relies on the facet coatings nor on the flared waveguides.

Other reflector means for providing optical feedback such as external mirrors or distributed feedback reflectors could also be utilized. In FIG. 5, a distributed feedback (DFB) reflector comprising a frequency selective grating 144 is formed in the surface of one of the semiconductor layers in optical proximity to the active region. For clarity of illustration, the grating 144 is shown not extending through the waveguides although grating 144 preferably extends through, above or below the waveguide to reflect portions of lightwaves propagating along the waveguides. In practice, the DFB reflector need not be in the same layer as the waveguides. For example, in FIG. 2, a DFB reflector 140 is formed in the top surface of substrate 72 while the waveguide structure is formed by blocking layer 80.

Returning to FIG. 4, coupling geometry 110 also comprises a plurality of interconnecting waveguides 120 for deflecting and coupling to light waves propagating in adjacent emitting cavities 112. Interconnecting waveguides 120 are the same width as emitting cavities 112, typically about 1.5 μm wide. The plurality of interconnecting waveguides 120 is grouped into two sets, a first set 120a and a second set 120b, each set of which couples together all of the optical emitting waveguide segments 112. The second set 120b of interconnecting waveguides is longitudinally spaced apart from first set 120a, i.e. in a direction of light propagation along the emitting segments 112, indicated by arrows 122.

Each interconnecting waveguide 120 joins two adjacent optical waveguides, such as waveguides 112a and 112b at respective Y-shaped branching junctions 124 and 126. Each Y-shaped junction has a Y-base and two Y-branches. Thus, for example, Y-shaped junction 124 has a Y-base 114a, which is an end portion of emitting segment 112a, a Y-branch 116a, which is a branch portion of emitting segment 112a, and a second Y-branch 120, which is an interconnecting waveguide. Likewise, Y-shaped junction 126 has a Y-base 128, which is a center portion of emitting segment 112b, a Y-branch 130, which is a branch portion of emitting segment 112b, and a second Y-branch 120, which is an interconnecting waveguide. Preferably, the Y-shaped junction is symmetric, i.e. the Y-base defines the bisector B of angle $\theta$ between the Y-branches.

In operation, light waves propagating in end portion 114a of optical emitting segment 112a away from facet 115a are split at Y-shaped junction 124, a portion of the light power continuing along branch portion 116a of segment 112a and a portion of the light power being deflected into interconnecting waveguide 120. Likewise, lightwaves propagating in adjacent segment 112b are directed into branch portion 130. Lightwaves propagating in interconnecting waveguide 120 and branch portion 130 combine at Y-shaped junction 126. Those modes in which segments 112a and 112b are in-phase continue to propagate along center section 128 while those modes which are out-of-phase radiate away. Thus the structure favors desirable in-phase operation. The lengths of the interconnecting waveguides 120 should be sufficiently long to establish good Michelson interferometer function and eliminate the out-of-phase components. Light waves propagating in the opposite direction toward facet 115a are split at junction 126 and combined at junction 124. In this manner, all of the emitting waveguide segments 112 can be locked in-phase.

While evanescent coupling may be used in conjunction with the direct coupling just described, preferably the direct coupling introduced by the interconnecting waveguides and Y-shaped junctions is stronger than the evanescent coupling between individual emitting waveguides. This is most easily done by choosing a particular index guided structure which eliminates evanescent coupling completely, but that elimination is not essential. The structures in FIGS. 1 and 3 are two such structures. The buried heterostructure shown in FIG. 1 uses strong index guiding properties to restrict light from coupling to adjacent waveguides and can result in lower thresholds. In FIG. 3 and to some extent FIG. 2, the structure is such that loss (or at least lower gain) between the guides minimizes evanescent wave coupling.

A principal feature of the coupling geometry is the presence of two sets 120a and 120b of interconnecting waveguides, each of which couples together all of the optical emitting waveguides 112 of the laser array. The plural sets provide redundant phase coupling operation in the event of a break in one or more branch. A branch or waveguide is said to suffer a break when it ceases to provide gain or fails to allow light propagation under lasing conditions. For example, in the event an end portion of 132 ceases to operate, a single Y-shaped junction 134 would fail to couple segments 136 and 138 and the laser array may begin to operate as two separate laser arrays. However, a second Y-shaped junction 140 couples segments 136 and 138 together along the path indicated by dashed line 142, bypassing the break.

Breaks or failures to operate by more than one segment are similarly bypassed by the second set of Y-shaped junctions, except where two or more adjacent waveguides simultaneously fail. If, for example, both adjacent branches 132 and 136 fail, the laser array may cease to operate in-phase. Similarly, a break in a center portion of a waveguide can not be bypassed by the coupling geometry in FIG. 4. However, the geometry in FIG. 4 is satisfactory for many cases since most failures occur in the end portions near the facets rather than the center portions, and the likelihood of adjacent branch failures is small.

In FIG. 5, a second coupling geometry 150 provides for continued in-phase operation in the event of failures in two adjacent optical emitting branches and failures in one center portion. Coupling geometry 150 includes a plurality of adjacent optical emitting branches 152 and three sets 154a, 154b and 154c are longitudinally spaced apart from each other along the emitting length.

The array in FIG. 5 can tolerate failures in end portions of two adjacent branches 158 and 160 since the path indicated by dashed line 162 bypasses both breaks via Y-shaped junction 168. The array can also tolerate single failures in a center portion 164 of a path bypassing the failure via path 162. Breaks in three or more adjacent end portions, such as branches 158, 159 and 160, breaks in two or more adjacent center portions, such as portions 164 and 166 or breaks in a center portion and a connected center portion, such as portions 164 and 170, cannot be bypassed by the geometry in FIG. 5. Additional sets of interconnecting waveguides and Y-shaped junctions may be provided if one desires a coupling geometry which can tolerate these less likely failure possibilities.

In FIG. 5, a "window" portion 148 of the semiconductor laser array 150 below dashed line 146 is transparent to radiation generated in the electrically excited active portion above dashed line 146. Window portions 148 which typically occur at an end of a laser array near a light emitting facet 165 are generally not pumped or electrically excited thereby forming a passive array to which parallel active waveguides 152 couple. The set of interconnecting waveguides 154c may be within the passive window portion 148, as shown, or the boundary 146 of the window portion may be closer to facet 165 to exclude set 154c of interconnecting waveguides. Window portions 148 can be made transparent to the wavelength of radiation from the active portion by, for example, impurity induced disordering. In this process the active region comprises a series of very thin quantum wells made up of alternative layers of GaAs and GaAlAs. An impurity, such as silicon or zinc, is introduced into the active region, then the wafer is heated to diffuse the impurity. During heating the GaAs and GaAlAs layers mix to produce a uniform smearing of the Al content in the active region. The smeared or mixed region in the passive array which is formed has a wider bandgap and is transparent to the longer wavelengths generated by the active region in the electrically excited portions of the semiconductor laser array. Other methods of forming transparent windows include etching away the active region and regrowing a new layer with a wider effective bandgap, and diffusing p-type dopant into an n-type active region. Window portions are not essential to the operation of the present invention but may be preferred in some applications, such as to prevent damage to the mirror facets 165.

In FIG. 6, a third fault tolerant coupling geometry 172 has a plurality of adjacent optical emitters 174 and two sets of interconnecting waveguides 176a and 176b. Each interconnection connects two emitting branches together at respective Y-shaped junctions 178. However, in the present embodiment, the interconnecting waveguides of first set 176a connect adjacent emitting branches such as 180 and 182 while the interconnecting waveguides of second set 176b connect emitting branches separated by an intervening lasing branch, i.e. spaced two emitting branches apart. Interconnecting waveguides cross over adjacent optical waveguides and intersect at an X-shaped junction 198.

The coupling geometry 172 of FIG. 6 can tolerate failures in the end portions of two adjacent emitters, such as 180 and 182, since the path indicated by dashed line 184 bypasses the break or failures via Y-shaped junction 186. Likewise breaks in the end portions on the opposite side of the array, such as failures in end portions 190 and 192, are bypassed by path 194 via Y-shaped junction 191. Coupling geometry 172 is also tolerant of single breaks or failures in center portions of cavities. For example, a failure in center portion 188 is bypassed by path 184. Branch and interconnecting waveguide portions, such as portion 196, may also be bypassed in the event of a failure. Thus, coupling geometry 172 operates in a manner similar to geometry 150 in FIG. 5.

The coupling geometries described herein are by no means exhaustive. The general idea is to introduce additional redundant sets of interconnections so as to be able to bypass breaks or failures in an emitting cavity. Thus, additional sets of interconnecting waveguides may be added to the two or three sets shown in FIGS. 4-6 to connect adjacent cavities or cavities separated by one or more intervening cavities. Each interconnecting waveguide may join two adjacent optical waveguides at Y-shaped junctions or X-shaped junctions. Moreover, evanescent coupling may be used in conjunction with the direct coupling at Y-junctions described herein. In any case, the structures described provide for laser arrays with longer lasting in-phase light emission than structures lacking redundancy.

We claim:
1. A semiconductor laser array comprising,
 a plurality of semiconductor layers disposed on a substrate, at least one of said layers forming an active region for light wave generation and propagation under lasing conditions,
 means for injecting current into said active region to produce said light waves,
 means for providing optical feedback to sustain laser operation,
 a plurality of spaced optical waveguides extending along at least a portion of said array, said optical waveguides allowing light propagation under lasing conditions, and
 a plurality of interconnecting waveguides for deflecting and coupling light waves propagating in said optical waveguides with light waves propagating in adjacent optical waveguides, each interconnecting waveguide joining two adjacent optical waveguides at respective branching junctions, said interconnecting waveguides being grouped into at least a first set and a second set, each set of interconnecting waveguides coupling all of said optical waveguides, said second set being spaced along a direction of light propagation from said first set.

2. The semiconductor laser array of claim 1 wherein said interconnecting waveguides further comprise a third set coupling all of said optical waveguides, said third set being spaced along a direction of light propagation from said first set and said second set.

3. The semiconductor laser array of claim 1 wherein said branching junctions are Y-shaped junctions having a Y-base and two Y-branches.

4. The semiconductor laser array of claim 1 wherein said optical waveguides and said interconnecting waveguides are defined by current confining channels communicating with said active region.

5. The semiconductor laser array of claim 4 wherein said current confining channels comprise gaps in a blocking layer spaced proximately to said active region.

6. The semiconductor laser array of claim 1 wherein said optical waveguides and said interconnecting waveguides are defined by refractive index changes in said layers with which said light waves interact.

7. The semiconductor laser array of claim 6 wherein said refractive index changes are provided by changes in thickness of at least one of said plurality of layers.

8. The semiconductor laser array of claim 7 wherein said active region varies in thickness, being thickest along said optical waveguides and said deflecting and coupling means.

9. The semiconductor laser of claim 1 wherein said waveguides allow propagation in only the lowest order transverse mode of the waveguide.

10. A semiconductor laser array comprising,
a plurality of semiconductor layers disposed on a substrate, at least one of said layers forming an active region for light wave generation and propagation under lasing conditions in a plurality of adjacent optical waveguides,
means for forward biasing said active region to produce light waves in said optical waveguides,
means for providing optical feedback to sustain laser operation, and
a plurality of sets of interconnecting waveguides, each interconnecting waveguide in a set joining two adjacent optical waveguides at respective junctions, each set coupling all of said optical waveguides and being spaced in a direction of light propagation from others of said sets.

11. The semiconductor laser array of claim 10 wherein the number of sets of interconnecting waveguides is two.

12. The semiconductor laser array of claim 10 wherein the number of sets of interconnecting waveguides is at least three.

13. The semiconductor laser array of claim 10 wherein said junctions are Y-shaped junctions, each Y-shaped junction comprising a Y-base and two Y-branches.

14. The semiconductor laser array of claim 10 wherein at least some of said junctions are X-shaped junctions.

15. The semiconductor laser array of claim 10 wherein each interconnecting waveguide in a first set joins two adjacent optical waveguides at respective Y-shaped junctions and each interconnecting waveguide in a second set joins two adjacent optical waveguides at X-shaped junctions.

16. The semiconductor laser array of claim 10 wherein said plurality of adjacent optical waveguides and said plurality of sets of interconnecting waveguides are defined by current confining channels communicating with said active region.

17. The semiconductor laser array of claim 16 wherein said current confining channels comprise gaps in a current blocking layer spaced proximately to said active region.

18. The semiconductor laser array of claim 10 wherein said plurality of adjacent optical waveguides and said plurality of sets of interconnecting waveguides are defined by refractive index changes in said layers with which said light waves interact.

19. The semiconductor laser array of claim 18 wherein said active region is thickest along and has zero thickness away from said adjacent optical waveguides and said plurality of sets of interconnecting waveguides.

20. The semiconductor laser array of claim 18 wherein said waveguides are defined by changes in the real refractive index in at least one optically guiding layer proximate to said active region.

21. The semiconductor laser array of claim 18 wherein said waveguides are defined by changes in the thicknesses of one or more optically guiding layers proximate to said active region.

22. The semiconductor laser array of claim 10 wherein said optical feedback means is a frequency selective grating reflector.

23. The semiconductor laser array of claim 10 further comprising one or more passive window portions of said array which are transparent to radiation from portions of said array which are electrically excited.

24. The semiconductor laser array of claim 23 wherein at least one of said sets of interconnecting waveguides is located proximate to said passive window portions.

* * * * *